(12) United States Patent
Tang et al.

(10) Patent No.: US 11,539,371 B1
(45) Date of Patent: Dec. 27, 2022

(54) DIGITAL-TO-ANALOG CONVERTER (DAC) CALIBRATION USING ERROR DACS

(71) Applicant: QUALCOMM Incorporated, San Diego, CA (US)

(72) Inventors: Zhilong Tang, Irvine, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/449,056

(22) Filed: Sep. 27, 2021

(51) Int. Cl.
*H03M 1/10* (2006.01)

(52) U.S. Cl.
CPC ................... *H03M 1/1014* (2013.01)

(58) Field of Classification Search
CPC .. H03M 1/0626; H03M 1/1009; H03M 1/742; H03M 1/0836; H03M 1/0863; H03M 1/1019; H03M 1/1061; H03M 1/183; H03M 1/66; H03M 1/662; H03M 1/68; H03M 1/687; H03M 1/745; H03M 1/747; H03M 1/785; H03M 1/802; H03M 1/825
USPC ............................ 341/118–12, 135, 136, 144
See application file for complete search history.

(56) References Cited

U.S. PATENT DOCUMENTS

| | | | | |
|---|---|---|---|---|
| 6,703,956 B1* | 3/2004 | Mueller | ................ | H03M 1/682 341/145 |
| 9,214,950 B1* | 12/2015 | Davis | ................ | H03M 1/0621 |
| 2009/0179783 A1* | 7/2009 | Matumoto | ............... | H03M 1/68 341/135 |
| 2010/0033356 A1* | 2/2010 | Oberhuber | .............. | H03M 1/06 341/94 |
| 2010/0283642 A1* | 11/2010 | Lai | ....................... | H03M 1/1061 341/120 |
| 2011/0050967 A1* | 3/2011 | Matsumoto | .......... | H04N 5/3741 348/E3.016 |
| 2012/0306678 A1* | 12/2012 | Hezar | ..................... | H03M 1/66 341/146 |
| 2014/0253350 A1* | 9/2014 | Imai | .................... | H03M 1/0617 341/118 |
| 2015/0349793 A1* | 12/2015 | Saripalli | ............. | H03M 1/1009 341/120 |
| 2017/0371457 A1* | 12/2017 | Fuwa | ...................... | G06F 3/045 |
| 2019/0313065 A1* | 10/2019 | Kitade | ............... | G11B 33/1466 |
| 2020/0099389 A1* | 3/2020 | Sung | ..................... | H03M 1/785 |

* cited by examiner

*Primary Examiner* — Linh V Nguyen
(74) *Attorney, Agent, or Firm* — Patterson & Sheridan, LLP

(57) ABSTRACT

Certain aspects of the present disclosure provide a digital-to-analog converter (DAC) system. The DAC system generally includes a plurality of current sources, a plurality of calibration DACs, each coupled to a respective one of the plurality of current sources, a reference current source, and a current mirror having a first branch selectively coupled to the plurality of current sources, wherein a second branch of the current mirror is coupled to the reference current source. The DAC system also includes a first error DAC selectively coupled to the first branch and the second branch of the current mirror, and a second error DAC selectively coupled to the first branch and the second branch of the current mirror.

20 Claims, 9 Drawing Sheets

| DAC Current Source Under Calibration | Reference used for Calibration | Post Calibration Error | Error to Ref (DNL) | Error Accumulation (INL) |
|---|---|---|---|---|
| | | D0=0 | D0 | |
| Ics1 | ref | D1= ref-Ics1 | D1 | D1+D0 |
| Ics2 | ref | D2 =ref-Ics2 | D2 | D2+D1+D0 |
| Ics3 | ref | D3 | D3 | D3+D2+D1+D0 |
| Ics4 | ref | D4 | D4 | D4+D3+D2+D1+D0 |
| Ics5 | ref | D5 | D5 | D5+D4+D3+D2+D1+D0 |
| . | . | . | . | . |
| . | . | . | . | . |
| . | . | . | . | . |

| DAC Current Source Under Calibration | Reference used for Calibration | Temp Reference | Post Calibration Error | Error to Ref (DNL) | Error Accumulation (INL) |
|---|---|---|---|---|---|
| Ics1 | ref | ref+D0 | D0=0 | D0 | |
| Ics2 | ref | ref+D1 | D1 | D1-D0 | D0+D1-D0=D1 |
| Ics3 | ref | ref+D2 | D2 | D2-D1 | D0+D1-D0+D2-D1=D2 |
| Ics4 | ref | ref+D3 | D3 | D3-D2 | D3 |
| Ics5 | ref | ref+D4 | D4 | D4-D3 | D4 |
| | | | D5 | D5-D4 | D5 |
| . | . | | . | . | . |
| . | . | | . | . | . |

FIG. 5B

DIGITAL-TO-ANALOG CONVERTER (DAC) CALIBRATION USING ERROR DACS

BACKGROUND

FIELD OF THE DISCLOSURE

Certain aspects of the present disclosure generally relate to electronic components and, more particularly, to circuitry for digital-to-analog conversion.

DESCRIPTION OF RELATED ART

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include one or more digital-to-analog converters (DACs) configured to convert signals from the digital domain to the analog domain for further processing (e.g., amplification and upconversion) prior to transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a digital-to-analog converter (DAC) system. The DAC system generally includes a plurality of current sources, a plurality of calibration DACs, each coupled to a respective one of the plurality of current sources, a reference current source, and a current mirror having a first branch selectively coupled to the plurality of current sources, wherein a second branch of the current mirror is coupled to the reference current source. The DAC system also includes a first error DAC selectively coupled to the first branch and the second branch of the current mirror, and a second error DAC selectively coupled to the first branch and the second branch of the current mirror.

Certain aspects of the present disclosure provide a method for digital-to-analog conversion. The method generally includes: selectively coupling a first branch of a current mirror to a plurality of current sources, wherein a second branch of the current mirror is coupled to a reference current source, and wherein each of a plurality of calibration DACs is coupled to a respective one of a plurality of current sources; selectively coupling a first error DAC to the first branch and the second branch of the current mirror; and selectively coupling a second error DAC to the first branch and the second branch of the current mirror.

Certain aspects of the present disclosure provide an apparatus for wireless communication. The apparatus generally includes: a transmit chain; a DAC coupled to the transmit chain, the DAC having a plurality of current sources configured to generate an analog signal based on a digital input code and provide the analog signal to the transmit chain; and a DAC calibration circuit coupled to the DAC. In some aspects, the DAC calibration circuit includes: a plurality of calibration DACs, each coupled to a respective one of the plurality of current sources; a reference current source; a current mirror having a first branch selectively coupled to the plurality of current sources, wherein a second branch of the current mirror is coupled to the reference current source; a first error DAC selectively coupled to the first branch and the second branch of the current mirror; and a second error DAC selectively coupled to the first branch and the second branch of the current mirror.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIGS. 5A and 5B are tables showing a comparison of error accumulations associated with different DAC calibration techniques, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for digital-to-analog conversion. A digital-to-analog converter (DAC) may include multiple current sources that supply currents in response to a digital input code to generate a corresponding output signal. Each current source may be coupled to a calibration DAC to compensate for error associated with the current source. However, even after calibration, the calibrated current for each current source may have an associated error. As a result, the individual errors of the current sources accumulate, which may lead to a significant total error. Certain aspects of the present disclosure are directed to techniques for breaking this error accumulation. For example, the current sources of the DAC may be calibrated sequentially by comparing the current supplied by the current source to a reference current. During each current source calibration phase, the associated reference current may be dynamically adjusted to compensate for the error of a previous current source calibration phase using two error DACs that work in a ping-pong fashion, as described in more detail herein.

Example Wireless Communications

Figure 1:
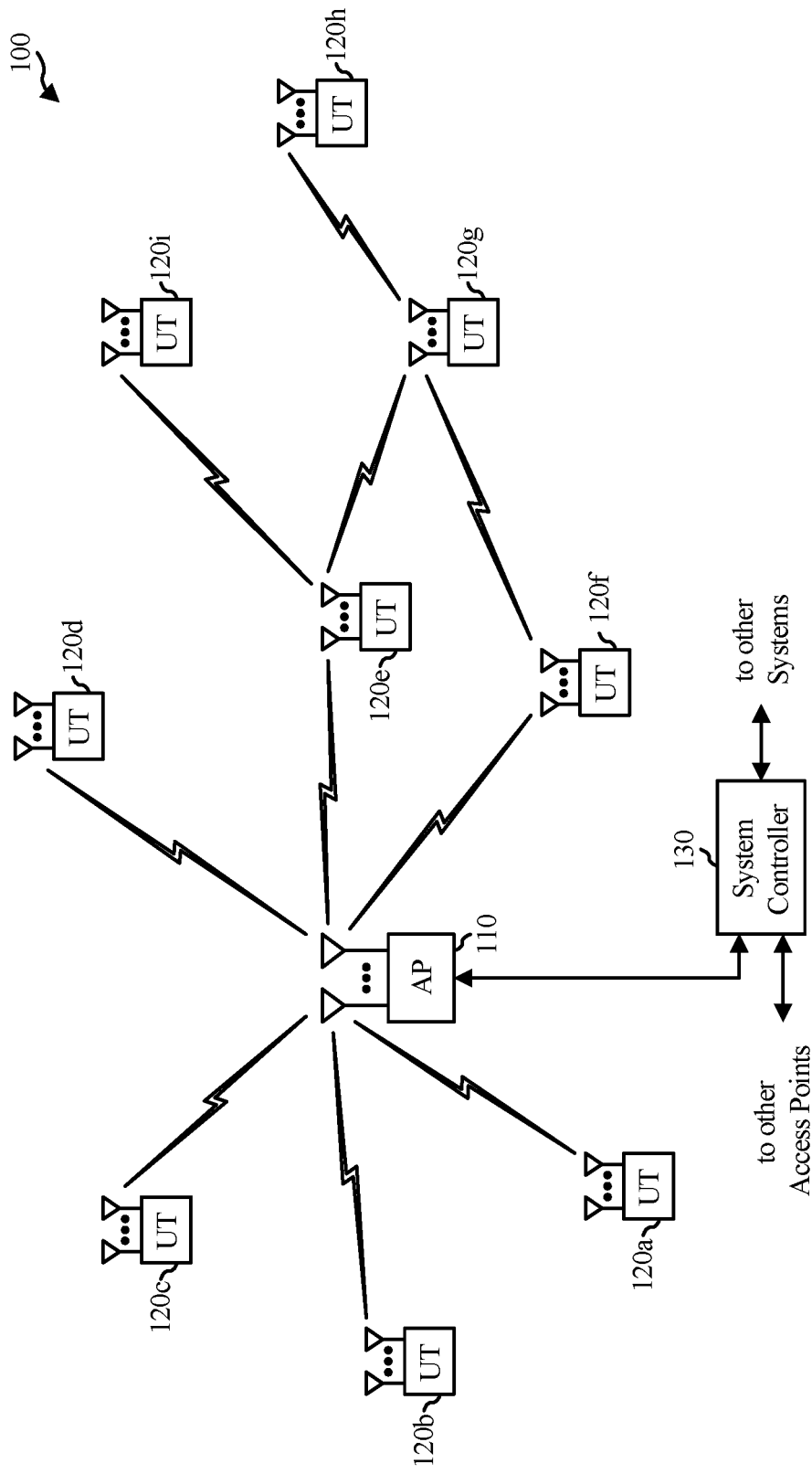
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a digital-to-analog converter (DAC) system including calibration circuitry implemented with error DACs, as described in more detail herein.

Figure 2:
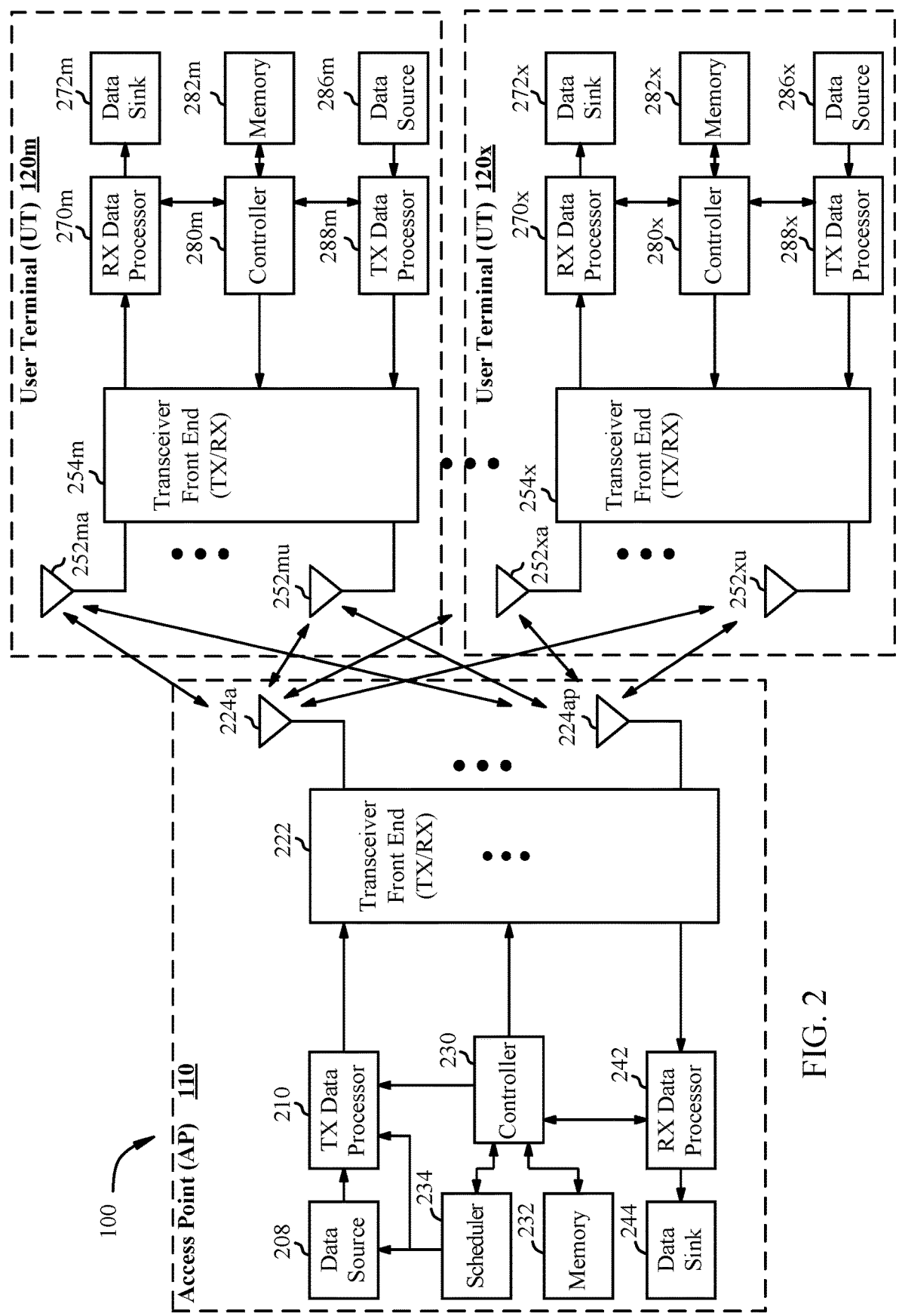
FIG. 2 is a block diagram of an example access point (AP) and example user terminals, in which aspects of the present disclosure may be practiced.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may have a DAC system including calibration circuitry implemented with error DACs, as described in more detail herein.

Figure 3:
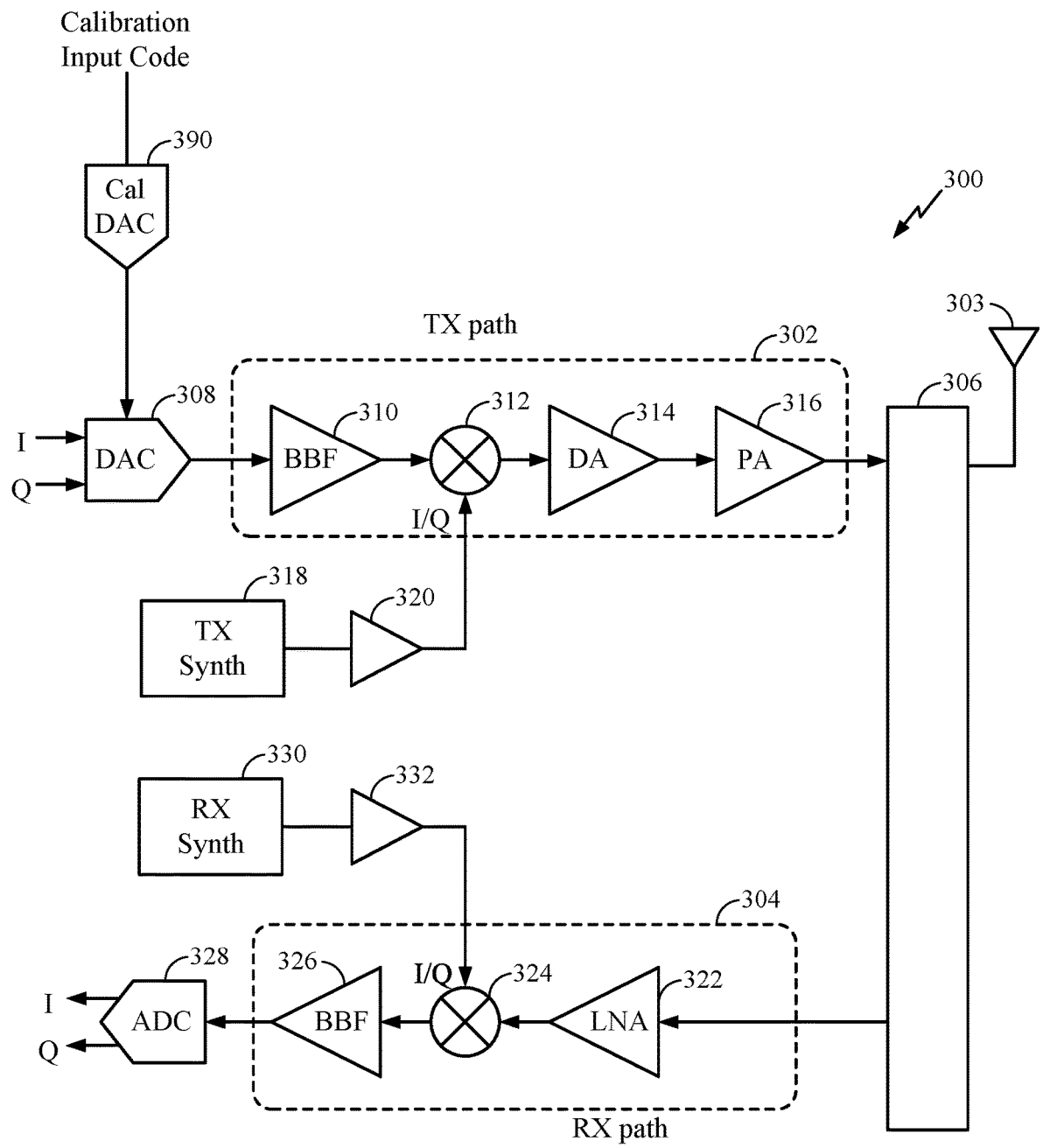
FIG. 3 is a block diagram of an example transceiver front end having a digital-to-analog converter (DAC), in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. In some aspects, transceiver front end 300 may include a DAC calibration circuit 390, which may include error DACs, as described in more detail herein. The DAC calibration circuit 390 may be used to calibrate the DAC 308 (e.g., also referred to as a "transmitter DAC"). The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Techniques For Digital-To-Analog Conversion

A digital-to-analog converter (DAC) calibration circuit (e.g., the DAC calibration circuit 390) may be used to compensate for (or at least reduce) current source errors associated with a DAC, such as DAC 308 of FIG. 3. For example, the DAC 308 may be implemented as a current-steering DAC, for example, and as such, may include multiple current sources that supply currents in response to a digital input code. Each current source may be coupled to a calibration DAC (e.g., as part of the DAC calibration circuit 390) to compensate for an error associated with the current source. The error may be a difference between the current supplied by the current source and a reference current. However, the calibrated current for each current source may have an associated residual error even after calibration. As a result, the individual errors of the current sources accumulate, which may lead to a significant total error. Certain aspects of the present disclosure are directed to techniques for breaking the error accumulation by, for example, using two error DACs, as described in more detail herein.

Figure 4A:
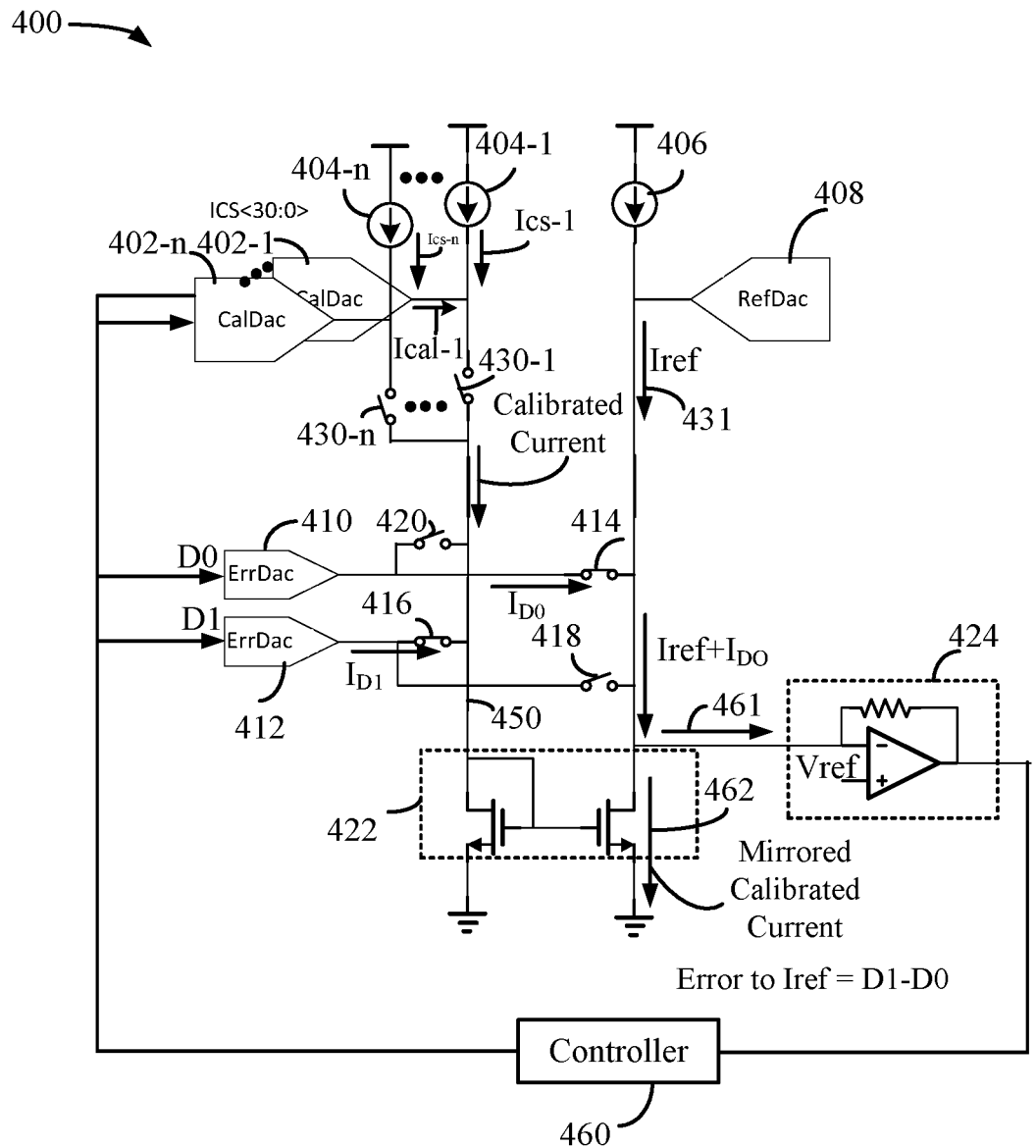
FIGS. 4A-4C illustrate different phases of a digital-to-analog conversion system implemented with DAC calibration, in accordance with certain aspects of the present disclosure.

FIG. 4A is block diagram of a DAC system 400 implemented with DAC calibration, in accordance with certain aspects of the present disclosure. As shown, the DAC system 400 includes current sources 404-1 to 404-n (collectively referred to herein as "current sources 404"), n being an integer greater than 1 and equal to the resolution of the DAC. The current sources 404-1 to 404-n provide respective currents Ics-1 to Ics-n (e.g., referred to herein as "DAC currents"). Each of the current sources 404 is controlled via a respective bit of a digital input code. The current sources 404-1 to 404-n may be selectively coupled to a first branch of a current mirror 422 at node 450 via respective switches 430-1 to 430-n (collectively referred to herein as "switches 430").

A reference current source 406 may be coupled to a second branch of the current mirror 422, as shown. As shown, a reference DAC 408 (refDac) may be coupled to a reference current path 431 such that a current Iref is generated that is equal to the sum of the reference current from the reference current source 406 and a current supplied by the reference DAC 408. During a reference current source calibration phase, the reference DAC 408 may provide a current such that Iref is equal to the current provided by one of the current sources 404 having the maximum current output among all the current sources 404. For example, due to variations associated with the current sources 404, one of the current sources 404 may provide the highest amount of current. Iref may be set (e.g., effectively set by the reference DAC 408) to be equal to the current supplied by this current source providing the highest amount of current.

As shown, calibration DACs 402-1 to 402-n (collectively referred to herein as "calibration DACs 402") are coupled to current sources 404, respectively. Each of the calibration DACs 402-1 to 402-n may supply a calibration current (Ical-1 to Ical-n, respectively) in an attempt to set the sum of Ical and Ics (referred to as the "calibrated current") to be equal to Iref (e.g., Iref+$I_{D0}$). In other words, calibration DAC 402-1 may provide a current Ical-1 in an attempt to set Ics-1+Ical-1 to be equal to Iref. For example, each of the calibration DACs 402 may be controlled separately during respective calibration phases. The digital input to each calibration DAC may be increased until the associated calibrated current is close to being equal to Iref+$I_{D0}$ without being greater than Iref+$I_{D0}$. This calibration may be performed using a sensing circuit 424 and a controller 460. For example, the calibrated current (e.g., the sum of Ical and Ics) is mirrored to generate the mirrored calibrated current 462, as shown. The current 461 flowing to the sense circuit 424 may be equal to (Iref+$I_{D0}$) minus the mirrored calibrated current 462. Thus, the sensing circuit 424 may sense the different between (Iref+$I_{D0}$) and the calibrated current, providing an indication to the controller 460 of when the calibrated current (e.g., mirrored calibrated current 462) is close to being equal to Iref+$I_{D0}$, as described herein.

Based on the indication from the sensing circuit 424, the controller 460 provides a digital signal to inputs of the calibration DACs 402 during respective calibration phases. However, even after calibration, a residual error may exist between the calibrated current and Iref (e.g., Iref+$I_{D0}$) due to the resolution of the calibration DACs 402. As a result, the errors associated with the current sources 404 accumulate, adversely impacting DAC accuracy.

Certain aspects provide techniques for preventing (or at least reducing) the accumulation of errors associated with the current sources 404, which may be accomplished using two error DACs, for example. As shown in FIG. 4A, for example, an error DAC 410 may be selectively coupled to the reference current path 431 or node 450 via respective switches 414, 420, and an error DAC 412 may be selectively coupled to the reference current path 431 or node 450 via respective switches 418, 416.

During a first phase (e.g., after the reference current source calibration phase), calibration DAC 402-1 may provide a current Ical-1 in an attempt to set Ics-1+Ical-1 to be equal to Iref. As described, due to the resolution of the calibration DAC 402-1, an error (D1) may exist between the calibrated current and Iref. While in the example provided, calibration is first performed for current sources 404-1, calibration may be performed starting with any of the calibration DACs 402 and associated one of current sources 404.

The switch 416 may be closed, and the switch 418 may be open, during the first phase. The error DAC 412 may provide a current $I_{D1}$ to compensate for this error (D1). Moreover, the switch 414 may be closed, and the switch 420 may be open. The error DAC 410 may also provide a current $I_{D0}$ to the reference current path 431 associated with an initial error value which may be 0. As used herein, an error DAC providing current to compensate for an error generally refers to the error DAC providing a current that at least compensates for a portion of the error and does not require compensation for the entire error.

Figure 4B:
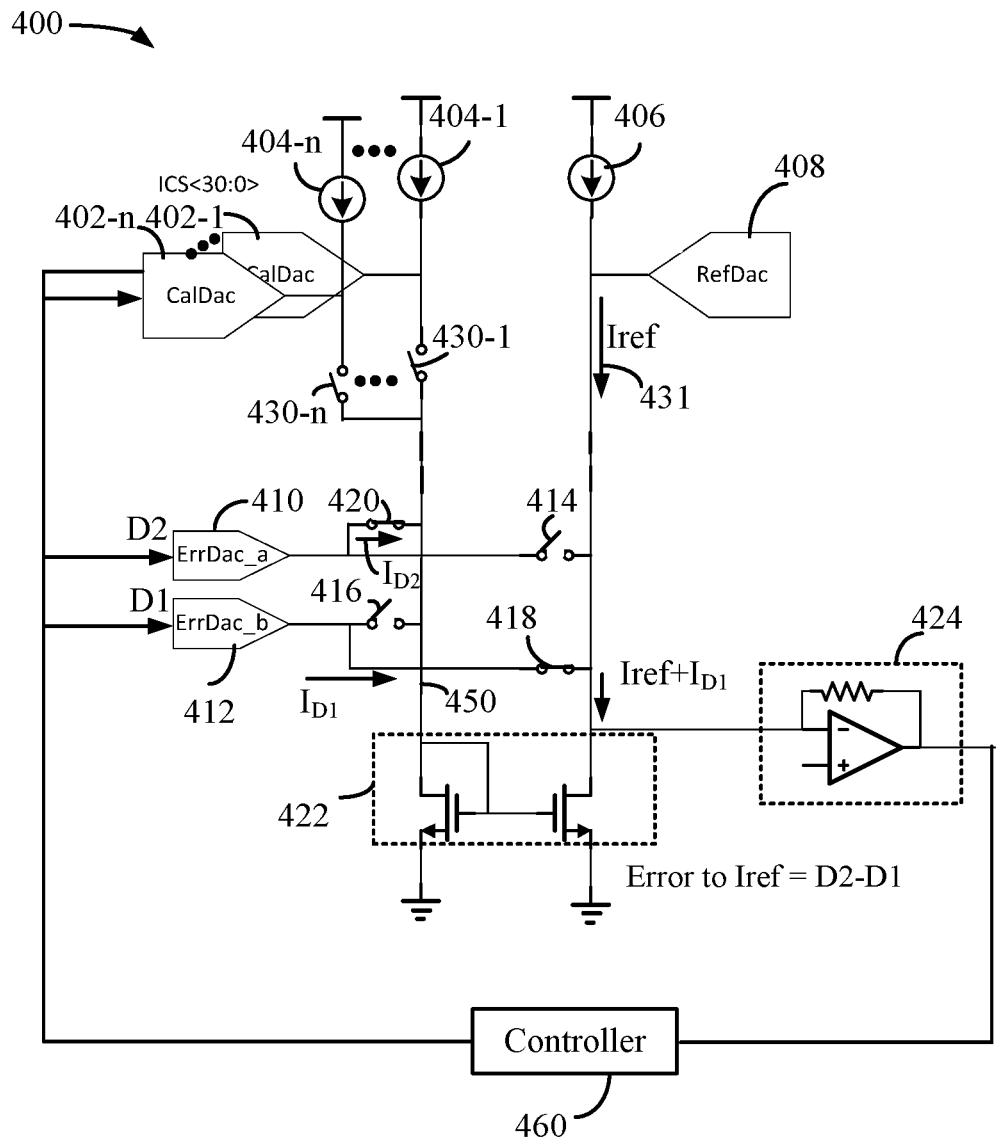

As shown in FIG. 4B, during a second phase, the switch 416 may be opened, and the switch 418 may be closed. Thus, the error DAC 412 now provides the current $I_{D1}$ (previously supplied to node 450 during the first phase) to the reference current path 431, generating an adjusted reference current (Iref+$I_{D1}$). As a result, the calibration DAC 402-2 may provide a current Ical-2 in an attempt to set Ics-2+Ical-2 to be equal to Iref+$I_{D1}$. In other words, the calibration DAC 402-2 attempts to calibrate for the current source 404-2 based on a difference between Ics-2 and Iref+$I_{D1}$ (e.g., instead of a difference between Ics-2 and Iref). Therefore, the calibration DAC 402-2 compensates for the error (D1) associated with Ics-1, preventing the errors from accumulating as calibration is performed for each of the current sources 404. The error between the calibrated current for current source 404-2 and Iref is now equal to D2 (e.g., error associated with calibration of current source 404-2) minus D1. While in the examples described herein, calibration is performed for current sources 404 in order from current source 404-1 to 404-n, the calibration for current sources 404 may be performed in any other order.

As shown, during the second phase, the switch 420 is closed, and switch 414 is opened. Error DAC 410 provides a current $I_{D2}$ representing the error D2 (e.g., error associated with calibration of current source 404-2) to node 450.

Figure 4C:
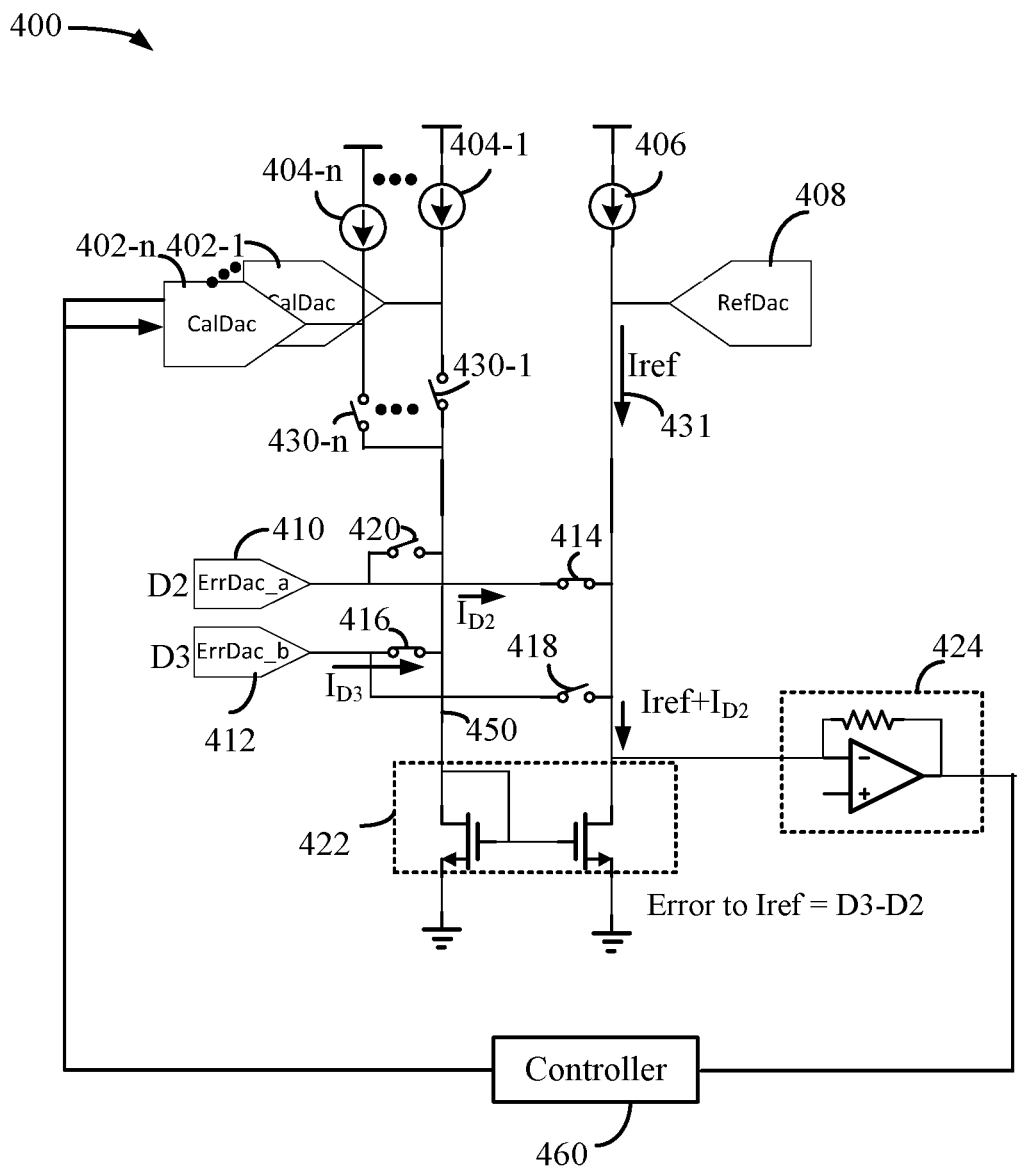

As shown in FIG. 4C, during a third phase, current $I_{D2}$ is now provided to the reference current path 431 such that the calibration DAC 402-3 compensates for the error D2, in a similar fashion as described with respect to the second phase. For example, the calibration DAC 402-3 may provide a current Ical-3 in an attempt to set Ics-3+Ical-3 to be equal to Iref+$I_{D2}$. The calibration DAC 402-3 compensates for the error (D2) associated with Ics-2. The error between the calibrated current for current source 404-3 and Iref is now equal to D3 (e.g., error associated with calibration of current source 404-3) minus D2. The error DAC 412 also provides a current $I_{D3}$ representing the error D3 (e.g., error associated with calibration of current source 404-3) to node 450, as shown. This process is repeated until the calibration settings for calibration DACs 402 are determined.

FIG. 5A is a table 500 showing accumulation of errors in a conventional calibrated DAC. As shown, for each of the DAC current sources under calibration (e.g., providing currents Ics1 to Ics5), a post calibration error may exist (D1 to D5, respectively). Calibration is performed based on Iref (shown as "ref" in table 500) for each DAC current source. For example, the post calibration error D1 may be equal to Iref minus Ics1, and the post calibration error D2 may be equal to Iref minus Ics2, and so on. Thus, the error between the calibrated current for the current sources and Iref (e.g., also referred to as differential non-linearity (DNL)) may be D1-D5. As a result, the errors of the current sources accumulate as shown, resulting in increasing integral non-linearity (INL). For example, the error accumulation for Ics1 may be equal to D1+D0 (e.g., where D0 is an initial error of 0), the error accumulation for Ics2 may be equal to D2+D1+D0, the error accumulation for Ics3 may be equal to D3+D2+D1+D0, and so on.

FIG. 5B is a table 501 showing error accumulation using a calibration technique in accordance with certain aspects of the present disclosure. As shown, for each DAC current source calibration, a temporary reference current (also referred to herein as an "adjusted reference current") is generated. For example, when calibrating the current source 404-2 providing Ics2, the temporary reference current is Iref+$I_{D1}$ (e.g., shown in table 501 as a reference value (ref) plus the error D1).

The post-calibration error for current source 404-2 would typically be equal to D2, as described with respect to FIG. 5A. However, as described, since calibration for current source 404-2 is performed based on the temporary reference current (Iref+$I_{D1}$), the calibrated current error to the reference current for current source 404-2 may be equal to D2−D1. As a result, the accumulation chain is broken. In other words, the error accumulation (or lack thereof) for current source 504-1 providing Ics1 is D0+D1−D0 which is equal to D1, the error accumulation (or lack thereof) for current source 404-2 providing Ics2 is D0+D1−D0+D2−D1 which is equal to D2, and the error accumulation (or lack thereof) for current source 504-3 providing Ics3 is D0+D1−D0+D2−D1+D3−D2 which is equal to D3, and so on. Therefore, as shown, the errors associated with the current sources do not accumulate using the calibration techniques described herein.

The aspects described herein are digital in nature and scalable. Two error DACs may be used to increase DAC accuracy for any DAC having any suitable number of current sources or bits. Moreover, error DACs can be implemented with any number of bits (e.g., 2 bits or greater) depending on specification(s). The aspects described herein also have little to no impact on DNL of the DAC system, while improving INL (e.g., by four times as compared to conventional implementations). Signal-to-noise-plus-distortion ratio (SNDR) may be constrained by INL. Therefore, with the same SNDR specification, the improvement of INL can be used to relax the accuracy of the calibration DACs 402, allowing for a reduction in the size of the calibration DACs. Since a calibration DAC is implemented for each of the current sources 404, reducing the size of the calibration DACs can significantly reduce the size of the DAC system 400.

Figure 6:
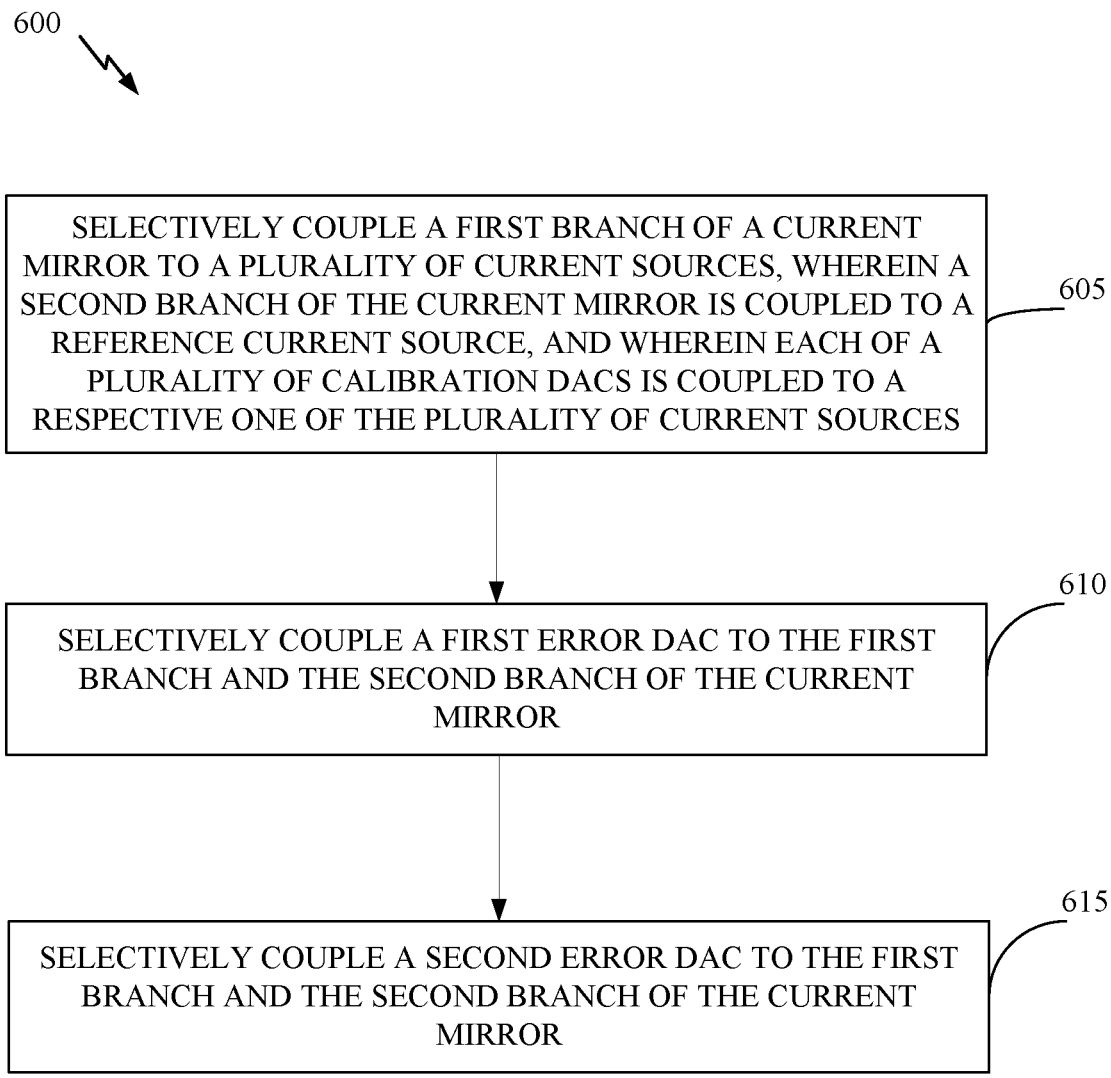
FIG. 6 is a flow diagram depicting example operations for digital-to-analog conversion, in accordance with certain aspects of the present disclosure.

FIG. 6 is a flow diagram depicting example operations 600 for digital-to-analog conversion, in accordance with certain aspects of the present disclosure. For example, the operations 600 may be performed by a DAC system, such as the DAC system 400.

The operations 600 begin, at block 605, with the DAC system selectively coupling (e.g., via switches 430) a first branch of a current mirror (e.g., current mirror 422) to a plurality of current sources (e.g., current sources 404). A second branch of the current mirror is coupled to a reference current source (e.g., reference current source 406). In some aspects, each of a plurality of calibration DACs (e.g., calibration DACs 402) is coupled to a respective one of the plurality of current sources.

At block 610, the DAC system selectively couples (e.g., via switches 414, 420) a first error DAC (e.g., error DAC 412) to the first branch and the second branch of the current mirror, and at block 615, selectively couples a second error DAC (e.g., error DAC 410) to the first branch and the second branch of the current mirror.

A first switch (e.g., switch 420) may be coupled between an output of the first error DAC and the first branch of the current mirror, a second switch (e.g., switch 414) may be coupled between the output of the first error DAC and the second branch of the current mirror, a third switch (e.g., switch 416) may be coupled between an output of the second error DAC and the first branch of the current mirror, and a fourth switch (e.g., switch 418) may be coupled between the output of the second error DAC and the second branch of the current mirror. In some aspects, the DAC system may control at least one of the plurality of calibration DACs based on a reference current (e.g., Iref+$I_{D0}$) generated via at least the reference current source and a mirrored current (e.g., mirrored calibrated current 462) flowing through the second branch of the current mirror.

In some aspects, during a first phase (e.g., as described with respect to FIG. 4A), the DAC system may provide a first calibration DAC current (e.g., Ical-1) via a first calibration DAC (e.g., calibration DAC 402-1) of the plurality of calibration DACs, and provide a first DAC current (e.g., Ics-1) via a first one of the plurality of current sources (e.g., current source 404-1). The first calibration DAC current and the first DAC current may be combined to provide a calibrated current. The DAC system may also provide (e.g., via the reference current source 406 and the reference DAC 408), a reference current (e.g., Iref) to a reference current path (e.g., reference current path 431) coupled to the second branch of the current mirror, and during the first phase, provide (e.g., via the error DAC 412) an error DAC current (e.g., $I_{D1}$) to the first branch of the current mirror based on a difference between the calibrated current and the reference current.

In some aspects, during a second phase (e.g., as described with respect to FIG. 4B), the DAC system provides, via the first error DAC, the first error DAC current to the reference current path (e.g., reference current path 431), and combines the first error DAC current and the reference current to provide an adjusted reference current (e.g., Iref+$I_{D1}$) to the second branch of the current mirror. In some aspects, during the second phase, the DAC system provides, via a second one of the plurality of current sources (e.g., current source 404-2), a second DAC current (e.g., Ics-2); provides, via a second calibration DAC of the plurality of calibration DACs (e.g., calibration DAC 402-2), a second calibration DAC current (e.g., Ical-2) based on a difference between the second DAC current and the adjusted reference current; and combines the second calibration DAC current and the second DAC current to provide a second calibrated current to the first branch of the current mirror. In some aspects, during the second phase, the DAC system provides, via the second error DAC, a second error DAC current based on a difference between the second calibrated current and the adjusted reference current.

In some aspects, during a third phase (e.g., as described with respect to FIG. 4C), the DAC system provides, via the second error DAC, the second error DAC current to the reference current path, and combines the second error DAC current and the reference current to provide another adjusted reference current (e.g., Iref+$I_{D2}$) to the second branch of the current mirror. During the third phase, the DAC system may also provide, via a third one of the plurality of current sources (e.g., current source 404-3), a third DAC current (e.g., Ics-3); provide (e.g., via a third calibration DAC of the plurality of calibration DACs (e.g., calibration DAC 402-3) a third calibration DAC current (e.g., Ical-3) based on a difference between the third DAC current and the other adjusted reference current; and combine the third calibration DAC current and the third DAC current to provide a third calibrated current to the first branch of the current mirror.

Example Aspects

Aspect 1. A digital-to-analog converter (DAC) system comprising: a plurality of current sources; a plurality of calibration DACs, each coupled to a respective one of the plurality of current sources; a reference current source; a current mirror having a first branch selectively coupled to the plurality of current sources, wherein a second branch of the current mirror is coupled to the reference current source; a first error DAC selectively coupled to the first branch and the second branch of the current mirror; and a second error DAC selectively coupled to the first branch and the second branch of the current mirror.

Aspect 2. The DAC system of claim 1, further comprising: a first switch coupled between an output of the first error DAC and the first branch of the current mirror; a second switch coupled between the output of the first error DAC and the second branch of the current mirror; a third switch coupled between an output of the second error DAC and the first branch of the current mirror; and a fourth switch coupled between the output of the second error DAC and the second branch of the current mirror.

Aspect 3. The DAC system of claim 1, further comprising: a sensing circuit having an input coupled to the second branch of the current mirror; and a controller having an input coupled to an output of the sensing circuit, wherein inputs of the plurality of calibration DACs are coupled to an output of the controller.

Aspect 4. The DAC system of claim 1, wherein, for a first phase: a first calibration DAC of the plurality of calibration DACs is configured to provide a first calibration DAC current; a first one of the plurality of current sources is configured to provide a first DAC current; and the first branch of the current mirror is configured to receive a calibrated current comprising the first calibration DAC current and the first DAC current.

5. The DAC system of claim 4, wherein: the reference current source is configured to provide a reference current to a reference current path coupled to the second branch of the current mirror; and for the first phase, the first error DAC is configured to provide an error DAC current based on a difference between the calibrated current and the reference current.

Aspect 6. The DAC system of claim 5, wherein, for a second phase: the first error DAC is configured to provide the first error DAC current to the reference current path; and the second branch of the current mirror is configured to receive an adjusted reference current comprising the first error DAC current and the reference current.

Aspect 7. The DAC system of claim 6, wherein, for the second phase: a second one of the plurality of current sources is configured to provide a second DAC current; a second calibration DAC of the plurality of calibration DACs is configured to provide a second calibration DAC current based on a difference between the second DAC current and the adjusted reference current; and the first branch of the current mirror is configured to receive a second calibrated current comprising the second calibration DAC current and the second DAC current.

Aspect 8. The DAC system of claim 7, wherein, for the second phase, the second error DAC is configured to provide a second error DAC current based on a difference between the second calibrated current and the adjusted reference current.

Aspect 9. The DAC system of claim 8, wherein, for a third phase: the second error DAC is configured to provide the second error DAC current to the reference current path; the second branch of the current mirror is configured to receive another adjusted reference current comprising the second error DAC current and the reference current; a third one of the plurality of current sources is configured to provide a third DAC current; a third calibration DAC of the plurality of calibration DACs is configured to provide a third calibration DAC current based on a difference between the third DAC current and the other adjusted reference current; and the first branch of the current mirror is configured to receive a third calibrated current comprising the third calibration DAC current and the third DAC current.

Aspect 10. A method for digital-to-analog conversion, comprising: selectively coupling a first branch of a current mirror to a plurality of current sources, wherein a second branch of the current mirror is coupled to a reference current source, and wherein each of a plurality of calibration DACs is coupled to a respective one of the plurality of current sources; selectively coupling a first error DAC to the first branch and the second branch of the current mirror; and selectively coupling a second error DAC to the first branch and the second branch of the current mirror.

Aspect 11. The method of claim 10, wherein: a first switch is coupled between an output of the first error DAC and the first branch of the current mirror; a second switch is coupled between the output of the first error DAC and the second branch of the current mirror; a third switch is coupled between an output of the second error DAC and the first branch of the current mirror; and a fourth switch is coupled between the output of the second error DAC and the second branch of the current mirror.

Aspect 12. The method of claim 10, further comprising controlling at least one of the plurality of calibration DACs based on a reference current generated via at least the reference current source and a mirrored current flowing through the second branch of the current mirror.

Aspect 13. The method of claim 10, further comprising, during a first phase: providing a first calibration DAC current via a first calibration DAC of the plurality of calibration DACs; and providing a first DAC current via a first one of the plurality of current sources, wherein the first calibration DAC current and the first DAC current are combined to provide a calibrated current.

Aspect 14. The method of claim 13, further comprising: providing, via the reference current source, a reference current to a reference current path coupled to the second branch of the current mirror; and during the first phase, providing, via the first error DAC, an error DAC current to the first branch of the current mirror based on a difference between the calibrated current and the reference current.

Aspect 15. The method of claim 14, further comprising, during a second phase: providing, via the first error DAC, the first error DAC current to the reference current path; and combining the first error DAC current and the reference current to provide an adjusted reference current to the second branch of the current mirror.

Aspect 16. The method of claim 15, further comprising, during the second phase: providing, via a second one of the plurality of current sources, a second DAC current; providing, via a second calibration DAC of the plurality of calibration DACs, a second calibration DAC current based on a difference between the second DAC current and the adjusted reference current; and combining the second calibration DAC current and the second DAC current to provide a second calibrated current to the first branch of the current mirror.

Aspect 17. The method of claim 16, further comprising, during the second phase, providing, via the second error DAC, a second error DAC current based on a difference between the second calibrated current and the adjusted reference current.

Aspect 18. The method of claim 17, further comprising, during a third phase: providing, via the second error DAC, the second error DAC current to the reference current path; combining the second error DAC current and the reference current to provide another adjusted reference current to the second branch of the current mirror; providing, via a third one of the plurality of current sources, a third DAC current; providing, via a third calibration DAC of the plurality of calibration DACs, a third calibration DAC current based on a difference between the third DAC current and the other adjusted reference current; and combining the third calibration DAC current and the third DAC current to provide a third calibrated current to the first branch of the current mirror.

Aspect 19. An apparatus for wireless communication, comprising: a transmit chain; a digital-to-analog converter (DAC) coupled to the transmit chain, the DAC having a plurality of current sources configured to generate an analog signal based on a digital input code and provide the analog signal to the transmit chain; a DAC calibration circuit coupled to the DAC, the DAC calibration circuit comprising: a plurality of calibration DACs, each coupled to a respective one of the plurality of current sources; a reference current source; a current mirror having a first branch selectively coupled to the plurality of current sources, wherein a second branch of the current mirror is coupled to the reference current source; a first error DAC selectively coupled to the first branch and the second branch of the current mirror; and a second error DAC selectively coupled to the first branch and the second branch of the current mirror.

Aspect 20. The apparatus of claim 19, further comprising: a first switch coupled between an output of the first error DAC and the first branch of the current mirror; a second switch coupled between the output of the first error DAC and the second branch of the current mirror; a third switch coupled between an output of the second error DAC and the first branch of the current mirror; and a fourth switch coupled between the output of the second error DAC and the second branch of the current mirror.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above.

Various modifications, changes and variations may be made in the arrangement, operation and details of the methods and apparatus described above without departing from the scope of the claims.

The invention claimed is:

1. A digital-to-analog converter (DAC) system comprising:
a plurality of current sources;
a plurality of calibration DACs, each coupled to a respective one of the plurality of current sources;
a reference current source;
a current mirror having a first branch selectively coupled to the plurality of current sources, wherein a second branch of the current mirror is coupled to the reference current source;
a first error DAC selectively coupled to the first branch and the second branch of the current mirror; and
a second error DAC selectively coupled to the first branch and the second branch of the current mirror.

2. The DAC system of claim 1, further comprising:
a first switch coupled between an output of the first error DAC and the first branch of the current mirror;
a second switch coupled between the output of the first error DAC and the second branch of the current mirror;
a third switch coupled between an output of the second error DAC and the first branch of the current mirror; and
a fourth switch coupled between the output of the second error DAC and the second branch of the current mirror.

3. The DAC system of claim 1, further comprising:
a sensing circuit having an input coupled to the second branch of the current mirror; and
a controller having an input coupled to an output of the sensing circuit, wherein inputs of the plurality of calibration DACs are coupled to an output of the controller.

4. The DAC system of claim 1, wherein, for a first phase:
a first calibration DAC of the plurality of calibration DACs is configured to provide a first calibration DAC current; a first one of the plurality of current sources is configured to provide a first DAC current; and
the first branch of the current mirror is configured to receive a calibrated current comprising the first calibration DAC current and the first DAC current.

5. The DAC system of claim 4, wherein:
the reference current source is configured to provide a reference current to a reference current path coupled to the second branch of the current mirror; and
for the first phase, the first error DAC is configured to provide an error DAC current based on a difference between the calibrated current and the reference current.

6. The DAC system of claim 5, wherein, for a second phase:
the first error DAC is configured to provide the first error DAC current to the reference current path; and
the second branch of the current mirror is configured to receive an adjusted reference current comprising the first error DAC current and the reference current.

7. The DAC system of claim 6, wherein, for the second phase:
a second one of the plurality of current sources is configured to provide a second DAC current;
a second calibration DAC of the plurality of calibration DACs is configured to provide a second calibration DAC current based on a difference between the second DAC current and the adjusted reference current; and
the first branch of the current mirror is configured to receive a second calibrated current comprising the second calibration DAC current and the second DAC current.

8. The DAC system of claim 7, wherein, for the second phase, the second error DAC is configured to provide a second error DAC current based on a difference between the second calibrated current and the adjusted reference current.

9. The DAC system of claim 8, wherein, for a third phase:
the second error DAC is configured to provide the second error DAC current to the reference current path;
the second branch of the current mirror is configured to receive another adjusted reference current comprising the second error DAC current and the reference current;
a third one of the plurality of current sources is configured to provide a third DAC current;
a third calibration DAC of the plurality of calibration DACs is configured to provide a third calibration DAC current based on a difference between the third DAC current and the other adjusted reference current; and
the first branch of the current mirror is configured to receive a third calibrated current comprising the third calibration DAC current and the third DAC current.

10. A method for digital-to-analog conversion, comprising:
selectively coupling a first branch of a current mirror to a plurality of current sources, wherein a second branch of the current mirror is coupled to a reference current source, and wherein each of a plurality of calibration DACs is coupled to a respective one of the plurality of current sources;
selectively coupling a first error DAC to the first branch and the second branch of the current mirror; and
selectively coupling a second error DAC to the first branch and the second branch of the current mirror.

11. The method of claim 10, wherein:
a first switch is coupled between an output of the first error DAC and the first branch of the current mirror;
a second switch is coupled between the output of the first error DAC and the second branch of the current mirror;
a third switch is coupled between an output of the second error DAC and the first branch of the current mirror; and
a fourth switch is coupled between the output of the second error DAC and the second branch of the current mirror.

12. The method of claim 10, further comprising controlling at least one of the plurality of calibration DACs based on a reference current generated via at least the reference current source and a mirrored current flowing through the second branch of the current mirror.

13. The method of claim 10, further comprising, during a first phase:
providing a first calibration DAC current via a first calibration DAC of the plurality of calibration DACs; and
providing a first DAC current via a first one of the plurality of current sources, wherein the first calibration DAC current and the first DAC current are combined to provide a calibrated current.

14. The method of claim 13, further comprising:
providing, via the reference current source, a reference current to a reference current path coupled to the second branch of the current mirror; and
during the first phase, providing, via the first error DAC, an error DAC current to the first branch of the current mirror based on a difference between the calibrated current and the reference current.

15. The method of claim 14, further comprising, during a second phase:
providing, via the first error DAC, the first error DAC current to the reference current path; and
combining the first error DAC current and the reference current to provide an adjusted reference current to the second branch of the current mirror.

16. The method of claim 15, further comprising, during the second phase:
providing, via a second one of the plurality of current sources, a second DAC current;
providing, via a second calibration DAC of the plurality of calibration DACs, a second calibration DAC current based on a difference between the second DAC current and the adjusted reference current; and
combining the second calibration DAC current and the second DAC current to provide a second calibrated current to the first branch of the current mirror.

17. The method of claim 16, further comprising, during the second phase, providing, via the second error DAC, a second error DAC current based on a difference between the second calibrated current and the adjusted reference current.

18. The method of claim 17, further comprising, during a third phase:
providing, via the second error DAC, the second error DAC current to the reference current path;
combining the second error DAC current and the reference current to provide another adjusted reference current to the second branch of the current mirror;
providing, via a third one of the plurality of current sources, a third DAC current;
providing, via a third calibration DAC of the plurality of calibration DACs, a third calibration DAC current based on a difference between the third DAC current and the other adjusted reference current; and
combining the third calibration DAC current and the third DAC current to provide a third calibrated current to the first branch of the current mirror.

19. An apparatus for wireless communication, comprising:
a transmit chain;
a digital-to-analog converter (DAC) coupled to the transmit chain, the DAC having a plurality of current sources configured to generate an analog signal based on a digital input code and provide the analog signal to the transmit chain;
a DAC calibration circuit coupled to the DAC, the DAC calibration circuit comprising:
a plurality of calibration DACs, each coupled to a respective one of the plurality of current sources;
a reference current source;
a current mirror having a first branch selectively coupled to the plurality of current sources, wherein a second branch of the current mirror is coupled to the reference current source;
a first error DAC selectively coupled to the first branch and the second branch of the current mirror; and
a second error DAC selectively coupled to the first branch and the second branch of the current mirror.

20. The apparatus of claim 19, further comprising:
a first switch coupled between an output of the first error DAC and the first branch of the current mirror;
a second switch coupled between the output of the first error DAC and the second branch of the current mirror;
a third switch coupled between an output of the second error DAC and the first branch of the current mirror; and
a fourth switch coupled between the output of the second error DAC and the second branch of the current mirror.

* * * * *